US006579624B2

(12) United States Patent
Choi et al.

(10) Patent No.: US 6,579,624 B2
(45) Date of Patent: Jun. 17, 2003

(54) FUNCTIONAL FILM HAVING OPTICAL AND ELECTRICAL PROPERTIES

(75) Inventors: Chaun-gi Choi, Suwon (KR); Young-rag Do, Seoul (KR); Joon-bae Lee, Yongin (KR); Chang-won Park, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 09/994,623

(22) Filed: Nov. 28, 2001

(65) Prior Publication Data

US 2002/0160218 A1 Oct. 31, 2002

(30) Foreign Application Priority Data

Feb. 7, 2001 (KR) .......................................... 2001-5937

(51) Int. Cl.[7] ................................................ B32B 5/14
(52) U.S. Cl. ....................... 428/610; 428/1.5; 428/1.15; 428/1.52; 428/628; 428/629; 428/630; 428/631; 428/632; 428/428; 428/432; 428/448; 428/450; 428/469; 428/472; 428/697; 428/699; 428/701; 428/702; 430/25; 430/321; 349/110
(58) Field of Search ................................ 428/1.51, 1.52, 428/1.62, 428, 432, 448, 450, 469, 472, 697, 699, 701, 702, 628, 629, 630, 631, 632, 610; 430/25, 321; 349/110

(56) References Cited

U.S. PATENT DOCUMENTS

| 4,243,735 A | | 1/1981 | Kobale et al. |
| 4,251,251 A | * | 2/1981 | Blankenship ................. 65/422 |
| 4,339,173 A | * | 7/1982 | Aggarwal et al. ........... 385/142 |
| 4,690,504 A | * | 9/1987 | Yokokawa et al. ......... 385/141 |
| 5,808,714 A | | 9/1998 | Rowlands et al. |
| 5,827,409 A | * | 10/1998 | Iwata et al. ............ 204/192.15 |
| 5,976,639 A | | 11/1999 | Iwata |
| 6,387,576 B2 | * | 5/2002 | Indutnyy Z. et al. ........... 430/7 |

FOREIGN PATENT DOCUMENTS

EP         1 046 727 A2      10/2000

OTHER PUBLICATIONS

WPI abstract of JP 580060166 A (Apr. 9, 1983).
U.S patent application Ser. No. 09/994,768, Chaun–gi Choi, et al., filed Nov. 28, 2001, Samsung SDI Co., Ltd., Suwon–city, Korea.
U.S patent application Ser. No. 09/741,108, Ivan Z. Indutnyy et al., filed Dec. 21, 2000, Samsung SDI Co., Ltd., Suwon–city, Korea.
U.S patent application Ser. No. 09/994,786, Chaun–gi Choi, et al., filed Nov. 28, 2001, Samsung SDI Co., Ltd., Suwon–city, Korea.

* cited by examiner

*Primary Examiner*—Deborah Jones
*Assistant Examiner*—Andrew T. Piziali
(74) *Attorney, Agent, or Firm*—Staas & Halsey LLP

(57)     ABSTRACT

A functional film includes a transition layer having a first constituent having SiO as a dielectric material and at least one second constituent selected from aluminum (Al), silver (Ag), silicon (Si), germanium (Ge), yttrium (Y), zinc (Zn), zirconium (Zr), tungsten (W) and tantalum (Ta). The first and second constituents have corresponding gradual content gradients according to a thickness of the functional film.

27 Claims, 4 Drawing Sheets

FUNCTIONAL FILM HAVING OPTICAL AND ELECTRICAL PROPERTIES

CROSS-REFERENCE TO RELATED APPLICATIONS

This application claims the benefit of Korean Application No. 2001-5937, filed Feb. 7, 2001, in the Korean Industrial Property Office, the disclosure of which is incorporated herein by reference.

BACKGROUND OF THE INVENTION

1. Field of the Invention

The present invention relates to a functional film, and more particularly, to a functional film having adjustable optical and electrical properties.

2. Description of the Related Art

A functional film having electrical conductivity while minimizing reflectance of the external light, has a variety of applications. These applications include use in sun glasses, external light shielding glass, UV protective and insulating materials, or electromagnetic shielding materials. The functional film is also used by a black matrix formed between phosphor layers of a color display device, such as a color cathode ray tube. In this context, the functional film is used to absorb external light and light scattered from adjacent phosphor layer patterns.

Generally, as the reflectance of the external light of a screen of a display device increases, a visible image becomes increasingly blurred. Since the external light is reflected mainly at a black matrix of the screen, attempts to improve luminance and contrast by increasing the absorbance of the black matrix surrounding pixels of the display device have been continuously made. Thus, a black matrix is fabricated to have a laminated film structure using chromium, and more specifically, using a film substrate consisting of a chromium layer and a chromium oxide layer. In order to further increase the absorptivity of the black matrix, carbon may be added to the chromium oxide layer.

U.S. Pat. No. 5,976,639 discloses a method of forming a black matrix for a liquid crystal display using a laminated film consisting of a transition layer and a metal layer on an inner surface of a display panel. According to this patent, the laminated film has a transition layer in which the content of one constituent element, such as Cr, W, Ta, Ti, Fe, Ni or Mo, increases between approximately 0.5% and 20% per 100 Å at the most in the incident direction of the external light. The transition layer may further include a constituent element such as oxygen, nitrogen or carbon. The metal element is desirably chromium. The transition layer is disposed between a low metal layer and a high metal layer. The content of the metal elements of the high metal layer is in the range of 50 to 100% by weight, and the content of the metal elements of the low metal layer is in the range of 10 to 50% by weight. The low metal layer is not the essential constituent from the viewpoint of the function of a black matrix.

The black matrix is manufactured by a reactive sputtering method in which a metal (chromium) target is placed on a magnetron cathode in a vacuum chamber, a first gas is introduced into the chamber for magnetron discharging, and a second gas (i.e., a reactive gas (oxygen or nitrogen) to react with the sputter metal elements) is introduced into the chamber. Sputtering is performed at an atmosphere in which the partial pressure of the reactive gas gradually decreases along the moving direction of a transparent substrate.

However, in the black matrix and preparation method thereof described in U.S. Pat. No. 5,976,639, materials that are environmentally detrimental, such as chromium, are used, and deposition should be performed at a reactive atmosphere. Also, during formation of the transition layer and the metal layer in the laminated film, the composition and thickness of each layer must be strictly controlled, which makes the manufacturing process complex.

SUMMARY OF THE INVENTION

To solve the above and other problems, it is an object of the present invention to provide a functional film having excellent mechanical, optical and electrical properties using a mixture of nontoxic metal other than chromium and a dielectric material.

Additional objects and advantages of the invention will be set forth in part in the description which follows and, in part, will be obvious from the description, or may be learned by practice of the invention.

To accomplish the above and other objects, a functional film according to an embodiment of the invention includes a transition layer having a first constituent having SiO as a dielectric material and at least one second constituent selected from aluminum (Al), silver (Ag), silicon (Si), germanium (Ge), yttrium (Y), zinc (Zn), zirconium (Zr), tungsten (W) and tantalum (Ta), where the first and second constituents have corresponding gradual content gradients according to a thickness of the functional film.

According to an aspect of the invention, the gradual content gradients are distributed such that a refractive index gradually increases or decreases in an incident direction of external light according to the thickness of the functional film.

According to another aspect of the invention, the gradual content gradients are distributed such that a light absorption efficiency gradually increases in the incident direction of the external light according to the thickness of the functional film.

According to yet another aspect of the invention, the gradual content gradients are distributed such that an electrical conductivity gradually increases or decreases according to the thickness of the functional film.

According to still another aspect of the invention, the gradual content gradients are distributed such that a content of the first constituent gradually decreases and a content of the second constituent gradually increases in the incident direction of the external light according to the thickness of the functional film.

According to another embodiment of the present invention, the functional film is deposited on a substrate, where a difference in a refractive index at an interface between the substrate and the functional film is less than or equal to 0.5.

According to yet another embodiment of the present invention, the functional film further includes a dielectric layer formed of SiO.

According to a further aspect of the invention, the dielectric layer is formed between the substrate and the transition layer so as to contact the substrate.

According to a yet further aspect of the invention, a difference in a refractive index between the dielectric layer and the substrate is less than or equal to 0.5.

According to still another embodiment of the present invention, the functional film further includes a conductive layer consisting of at least one metal constituent selected from the group consisting of aluminum (Al), silver (Ag), silicon (Si), germanium (Ge), yttrium (Y), zinc (Zn), zirconium (Zr), tungsten (W) and tantalum (Ta).

According to an additional aspect of the invention, the formation location of the conductive layer is formed on a face opposite an interface between the functional film and the substrate in the cases where the functional film is used in the fields requesting electrical conductivity characteristics and the second constituent is silicon and the Si content increases according to the thickness of the functional film.

According to an additional embodiment of the invention, the functional film includes a dielectric layer and a conductive layer, where the conductive layer is formed of a metal constituent selected from the group consisting of Al, Ag, Si, Ge, Y, Zn, Zr, W and Ta disposed on a face opposite an interface between the functional film and the dielectric layer.

BRIEF DESCRIPTION OF THE DRAWINGS

The above objects and advantages of the present invention will become more apparent and more readily appreciated by describing in detail preferred embodiments thereof with reference to the accompanying drawings in which.

DETAILED DESCRIPTION OF THE PREFERRED EMBODIMENTS

Figure 1:
FIG. 1 is a schematic diagram illustrating the structure of a functional film according to an embodiment of the present invention.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

Figure 2:
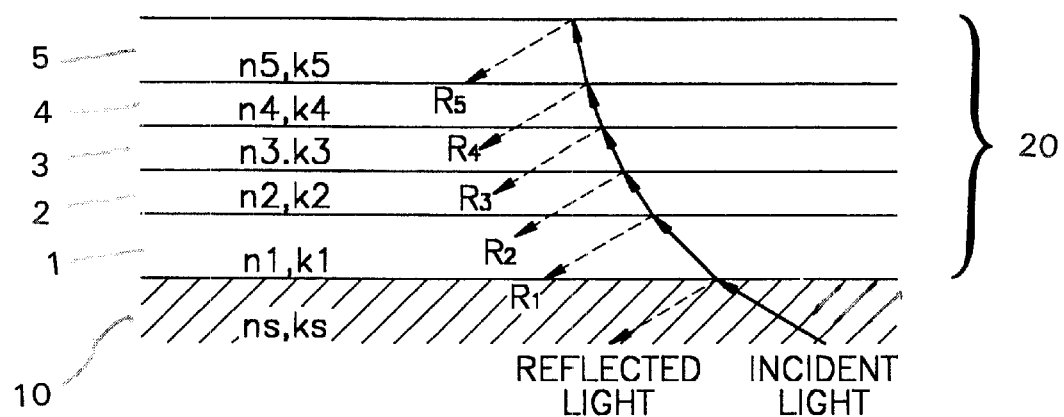
FIG. 2 is a diagram illustrating the principle of a functional film according to another embodiment of the present invention.

As shown in FIGS. 1 and 2, a functional film 20 according to an embodiment of the present invention has gradients in a refractive index, an extinction coefficient, and an electrical conductivity such that the relative contents of SiO as a dielectric material and at least one metal constituent selected from aluminium (Al), silver (Ag), silicon (Si), germanium (Ge), yttrium (Y), zinc (Zn), zirconium (Zr), tungsten (W) and tantalum (Ta) gradually vary by adjusting the rates at which the dielectric material and the metal constituent are deposited on a substrate 10 according to a thickness of the functional film 20. However, it is understood that other constituents and methods can be used. Further, while the functional film 20 is shown as only being a transition layer, it is understood that additional layers could be added in addition to the transition layer.

The reflectance of the functional film 20 is the square of the absolute value of a reflection coefficient (r) that is generally represented by formula (1):

$$r = \frac{N_s - N_f}{N_s + N_f} = \frac{(n_s - n_f) + i(k_s - k_f)}{(n_s + n_f) + i(k_s + k_f)} \qquad (1)$$

where $N_s$ and $N_f$ denote complex refractive indices, $n_s$ and $n_f$ denote refractive indices and $k_s$ and $k_f$ denote extinction coefficients, of the substrate 10 and the film 20, respectively.

In order to reduce the reflectance of the film 20, a smaller difference in the refractive index between the substrate 10 and the film 20 is more preferred. In other words, if the refractive indices of the substrate 10 and the film 20 become equal, no reflection occurs. A film 20 in which only absorption occurs and no reflection occurs is obtained by gradually varying (increasing or decreasing) the refractive index in an increasing direction of the thickness of the film 20.

Based on the above-described principle, the functional film 20 shown in FIG. 2 includes a first material 1, which is a dielectric material whose refractive index is very similar to that of the substrate 10, is coated on a portion adjacent to the substrate 10. Here, it is assumed that the refractive index and the extinction coefficient of the substrate 10 are $n_s$ and $k_s$, as noted above, and the refractive index and the extinction coefficient of the first material 1 are $n_1$ and $k_1$. Since there is little difference in the refractive index between the substrate 10 and the first material 1, the reflection of light can be almost completely avoided based on the principle represented by formula (1).

Then, a second material 2 (refractive index: $n_2$, extinction coefficient: $k_2$) having substantially the same refractive index as the first material 1 is deposited on the first material 1, thereby reducing the reflectance of light based on the same principle as described above. Similarly, a third material 3 having a refractive index of $n_3$ and an extinction coefficient of $k_3$, a fourth material 4 having a refractive index of $n_4$ and an extinction coefficient of $k_4$, a fifth material 5 having a refractive index of $n_5$ and an extinction coefficient of $k_5$, and so on, are deposited based on the same principle as described above.

The gradient in the refractive index can be created such that the refractive index gradually increases or decreases as a function of a thickness of the film 20. In order to reduce the reflectance of the external light and to increase the light absorption efficiency, the deposition is preferably performed in such a manner that the extinction coefficient increases in the incident direction of the external light. By letting the extinction coefficient gradually increase according to the thickness of the film 20, the amount of light passing through the film 20 can be made to gradually decrease until no light is transmitted when the thickness reaches a predetermined level.

Also, the electrical conductivity of the film 20 is made to gradually change by varying the metal content of the second constituent according to the thickness thereof, thereby maximizing the utilization efficiency of the film 20. In other words, if the content of the metal elements increases along the direction from a face contacting the substrate 10 to the opposite face according to the thickness of the film 20 so as to gradually increase the electrical conductivity, the reflectance of the external light is minimized to realize an optical structure having a high electrical conductivity. Such a structure can effectively prevent charge accumulation when used as an electromagnetic shielding material or a black matrix of a display device.

SiO is preferably used as the dielectric material in the functional film 20 according to an embodiment of the present invention since it is similar to a general glass substrate 10 in view of composition, resulting in similarity in various properties including refractive index. However, other dielectric materials can be used, and can also be varied according to a corresponding glass or non-glass substrate 10.

Also, in the functional film 20 according to an embodiment of the present invention, the second constituent is preferably at least one metal constituent selected from the group consisting of Al, Ag, Si, Ge, Y, Zn, Zr, W and Ta because of a high light absorption efficiency k. Specifically, Al and Ag are more preferred because of their high electrical conductivity.

In the functional film 20 according to an embodiment the present invention, the gradual content gradients are preferably distributed such that the refractive index gradually increases or decreases in the incident direction of the external light according to the thickness of the film 20. Also, the gradual content gradients are preferably distributed such that the light absorption efficiency gradually increases in the incident direction of the external light according to the thickness of the film 20. The gradual content gradients are preferably distributed such that the electrical conductivity gradually increases or decreases according to the thickness of the film 20. Also, the gradual content gradients are preferably distributed such that the content of the first constituent gradually decreases and the content of the second constituent gradually increases in the incident direction of the external light according to the thickness of the film 20.

According to an embodiment of the present invention, the substrate 10 has a refractive index that is less than or equal to 0.5 different from a refractive index of one face of the film 20 contacting the substrate 10. If the difference is greater than 0.5, the reflectance of the film 20 undesirably increases as compared to the substrate 10, particularly a glass substrate 10.

Figure 6:
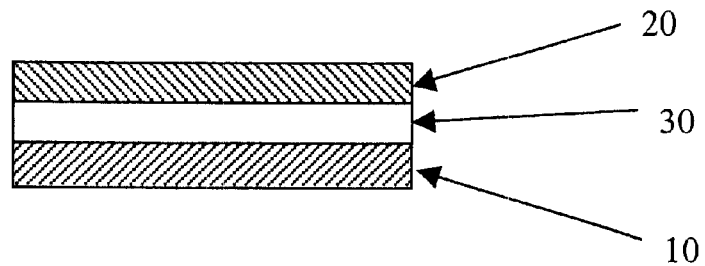
FIG. 6 is a schematic diagram illustrating the structure of a functional film including a dielectric layer according to a further embodiment of the present invention.

According to another embodiment of the present invention shown in FIG. 6, the functional film 20 may further include a dielectric layer 30 formed of SiO. Here, the dielectric layer 30 is preferably between the substrate 10 and the functional film 20, and more particularly the transition layer of the functional film 20, such that it contacts the substrate 10.

According to the present invention, a difference in the refractive index between the dielectric layer 30 and the substrate 10 is preferably less than or equal to 0.5. If greater than 0.5, the reflectance of the film 20 undesirably increases as compared to the substrate 10, particularly if the substrate 10 is a glass substrate.

Figure 7:
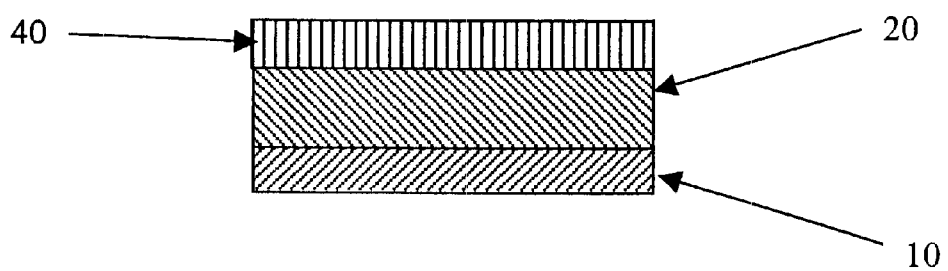
FIG. 7 is a schematic diagram illustrating the structure of a functional film including a dielectric layer according to a yet further embodiment of the present invention.

According to still another embodiment of the present invention shown in FIG. 7, the functional film 20 further includes a conductive layer 40 consisting of at least one metal constituent selected from the group consisting of aluminum (Al), silver (Ag), germanium (Ge), yttrium (Y), zinc (Zn), zirconium (Zr), tungsten (W) and tantalum (Ta). The formation location of the conductive layer 40 is not specifically restricted. However, in view of a low resistance characteristic of the film 20, the conductive layer 40 is preferably formed on a face opposite to the face where the film 20 contacts the substrate 10 in the cases where the functional film 20 is used in the fields requiring electrical conductivity characteristics and the second constituent content increases according to the thickness of the film 20.

Figure 8:
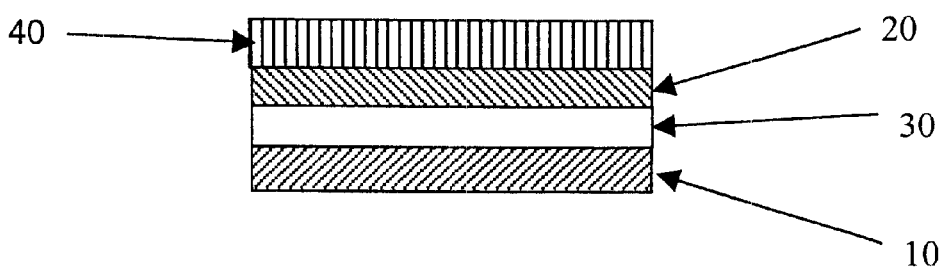
FIG. 8 is a schematic diagram illustrating the structure of a functional film including a dielectric layer and a conductive layer according to a still further embodiment of the present invention.

The functional film 20 according to the embodiment of the present invention shown in FIG. 8 includes a dielectric layer 30 and a conductive layer 40. The conductive layer 40 is formed on a face opposite to a face at which the functional film 20 contacts the dielectric layer 30.

The functional film according to the present invention is manufactured according to an embodiment of the invention using a general method of forming a thin film, for example, sputtering, vacuum deposition, PVD, CVD and so on. In one embodiment using sputtering, the first constituent, which is a dielectric material, is subjected to RF magnetron sputtering. The second constituent, which contains metal elements, is subjected to RF or DC sputtering. A sputtering apparatus preferably includes a vacuum chamber equipped with a pumping system, a magnetron cathode positioned in the vacuum chamber, a target disposed on the magnetron cathode (e.g., the first or the second constituent) and, an argon gas inlet system for magnetron discharging. The RF power is first applied to the first constituent having the dielectric material to initiate deposition of the first constituent on a substrate 10. The DC or RF power applied to the second constituent containing the metal elements is gradually increased while gradually decreasing the RF power applied to the first constituent to thereby form a functional film 20 having relative content gradients of the first and second constituents on the substrate 10.

Figure 3:
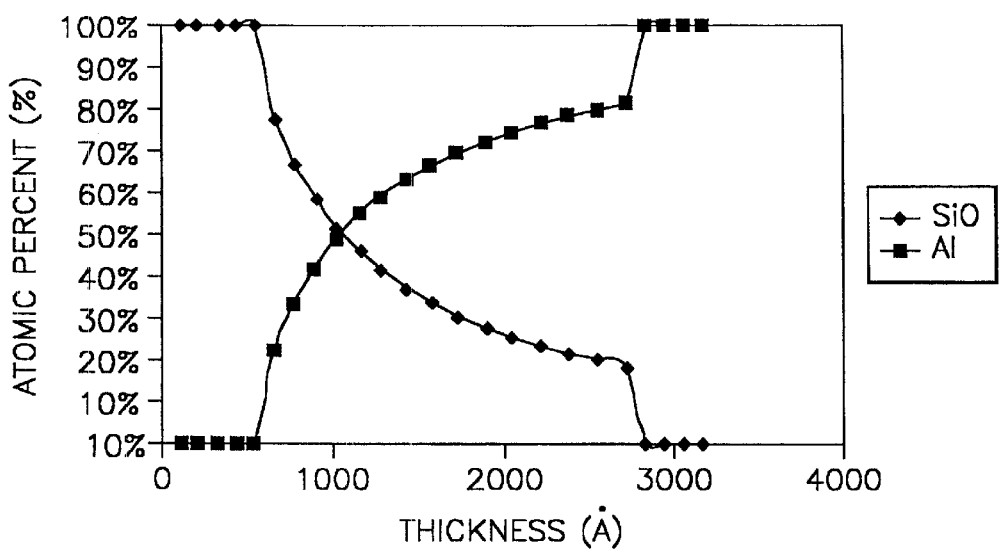
FIG. 3 is a diagram illustrating a change in the distribution of silicon oxide (SiO) as a dielectric material and silver (Ag) as a metal constituent of a functional film according to yet another embodiment of the present invention.
Figure 4:
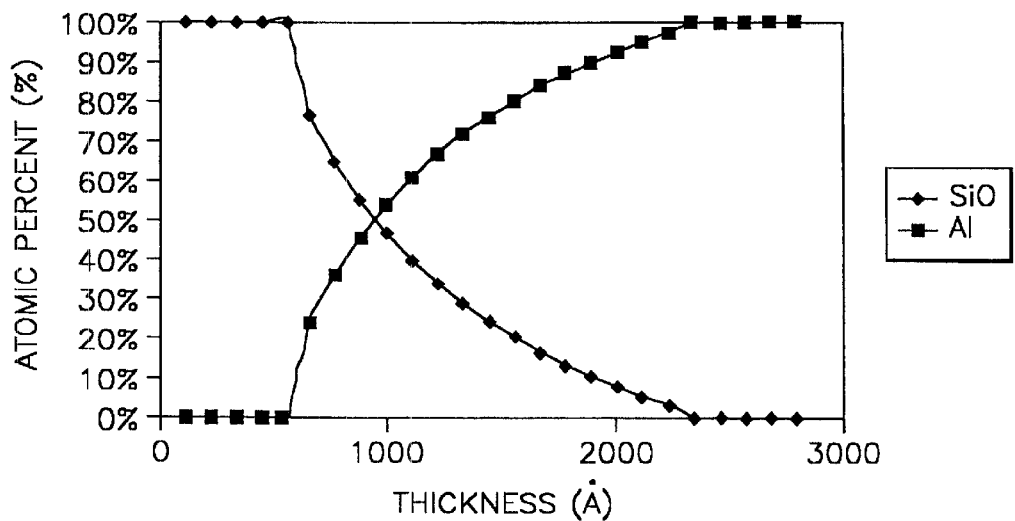
FIG. 4 is a diagram illustrating a change in the distribution of silicon oxide (SiO) as a dielectric material and aluminum (Al) as a metal constituent of a functional film according to still another embodiment of the present invention.
Figure 5:
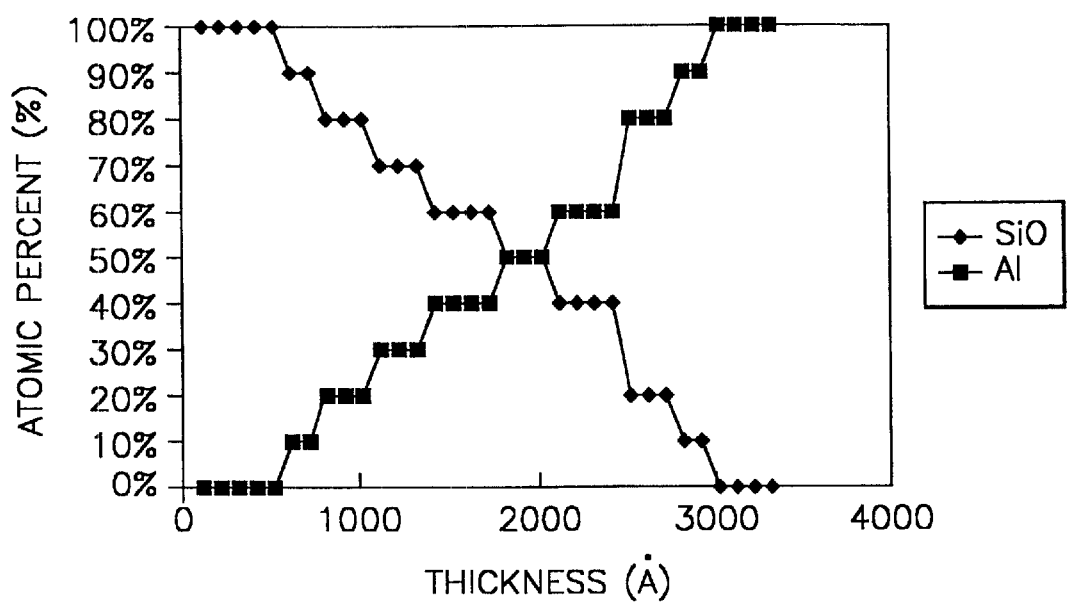
FIG. 5 is a diagram illustrating a change in the distribution of silicon oxide (SiO) as a dielectric material and aluminum (Al) as a metal constituent of a functional film according to still yet another embodiment of the present invention.

The functional film 20 can be deposited such that the relative compositions of the first and second constituents linearly vary as shown in FIGS. 3 and 4, but the present invention is not limited thereto. Alternatively, the deposition may also be performed so that the relative compositions of the first and second constituents have stepped gradients as shown in FIG. 5. In other words, by linearly increasing or decreasing RF or DC power applied to the respective targets as shown in FIGS. 3 and 4, the linear content gradients may be created. Alternatively, as shown in FIG. 5, a functional film 20 having a stepped gradient can be obtained by gradually applying predetermined RF or DC power to a target.

As described above, after performing the sputtering of the SiO and the metal to thus manufacture the functional film 20 according to the present invention, a subsequent process necessary according to the use of the functional film 20 may be performed. For example, if a black matrix of a display device is intended to be manufactured, the functional film is further patterned through a photolithography process. However, it is understood that other process can be performed to obtain a patterned black matrix.

The present invention will now be described in detail through the following examples, but it is not limited thereto.

EXAMPLE 1

A silicon oxide (SiO) target and a silver (Ag) target were placed on a magnetron cathode while maintaining a base pressure at $5 \times 10^{-6}$ torr or less. The SiO was subjected to RF magnetron sputtering and the Ag was subjected to DC magnetron sputtering. An Ar gas was injected and the degree of vacuum was maintained at 3.0 mtorr. Then, power was applied to the SiO and Ag targets so that the SiO and the Ag were simultaneously deposited. In order to provide content gradients of the SiO and Ag, the power applied to the SiO was gradually decreased and the power applied to the Ag was gradually increased. When the thickness of the SiO—Ag film became 2000–2500 Å, the power applied to the SiO was turned off and only the Ag was deposited to a thickness of 1000 Å.

EXAMPLE 2

A functional film was manufactured in the same manner as in Example 1, except that Al was used as the second constituent instead of the Ag.

EXAMPLE 3

A functional film was manufactured in the same manner as in Example 1, except that Ge was used as the second constituent instead of the Ag.

EXAMPLE 4

A functional film was manufactured in the same manner as in Example 1, except that Zn was used as the second constituent instead of the Ag.

EXAMPLE 5

A functional film was manufactured in the same manner as in Example 1, except that Zr was used as the second constituent instead of the Ag.

EXAMPLE 6

A functional film was manufactured in the same manner as in Example 1, except that W was used as the second constituent instead of the Ag.

EXAMPLE 7

A functional film was manufactured in the same manner as in Example 1, except that Ta was used as the second constituent instead of the Ag.

EXAMPLE 8

A functional film having a stepped gradient, as shown in FIG. 5, was manufactured using Al as the second constituent.

The functional films prepared in Examples 1 and 2 have compositional distribution as shown in FIGS. 3 and 4. Referring to FIGS. 3 and 4, in the functional film formed on the soda-lime substrate, the content of the SiO gradually decreases according to the thickness from the face contacting the substrate to the opposite face in the incident direction of the external light, while the content of the metal elements gradually increases. FIGS. 3 and 4 show the cases in which compositions of targets vary linearly, but not limited thereto. Alternatively, as shown in FIG. 5, the deposition may be performed so as to have a stepped gradient.

In the functional film having the above-described compositional distributions according to the present invention, the dielectric material and metal elements are slowly deposited so as to have inversely proportional content gradients. This process creates gradual gradients in view of the refractive index, the light absorption efficiency and the electrical conductivity.

The refractive indices of $SiO_2$, used as a general substrate, and a pure SiO layer, which is at an area of the film contacting the substrate, are substantially the same (i.e., approximately 1.7). Thus, the external light is not reflected at the interface between the substrate and the functional film, but is instead transmitted. Also, as the metal elements of the functional film increase, the refractive index and light absorption efficiency gradually increase so that the external light is not reflected but is almost absorbed. Also, as the content of the metal elements gradually increases, the electrical conductivity of the functional film gradually increases accordingly, so that a conductive layer consisting of 100% metal elements can be finally produced.

Electric and optical properties of the functional films manufactured in Examples 1 through 8 were evaluated and the evaluation results are summarized in Table 1.

In Table 1, the reflectance and optical density were measured at a wavelength of 550 nm using a UV-visible ray spectrometer, and the sheet resistance Rs was measured by a 4-point probe method.

TABLE 1

| Dielectric material/Metal | Rs (mΩ/□) | Reflectance (550 nm, %) | Optical density | Thickness (Å) |
|---|---|---|---|---|
| Example 1 SiO/Ag | 235 | 1.3 | 4.5 | 3300 |
| Example 2 SiO/Al | 630 | 1.2 | 4.2 | 3000 |
| Example 3 SiO/Ge | — | 1.2 | 4.3 | 3200 |
| Example 4 SiO/Zn | 980 | 1.4 | 4.2 | 3100 |
| Example 5 SiO/Zr | 4050 | 1.1 | 4.0 | 3150 |
| Example 6 SiO/W | 1120 | 0.9 | 4.6 | 3300 |
| Example 7 SiO/Ta | 3060 | 1.1 | 4.2 | 3000 |
| Example 8 SiO/Al | 630 | 0.5 | 4.2 | 3300 |

From Table 1, it was understood that the functional films according to Examples 1 through 8 had good reflectance, sheet resistance and optical density. Specifically, the functional films exhibited a sheet resistance of approximately 200 to approximately 4000 mΩ/□, a reflectance of 1.4 or less, and an optical density of 4.0 or greater.

In the functional film according to the present invention, in order to greatly reduce the reflectance of the film, the refractive index of the film can be easily adjusted to be substantially the same as that of a substrate. Also, while gradually varying the refractive index of the film, the film can be finally provided with desired electrical properties so that the film has both a light absorption layer and a conductive layer. Therefore, the functional film according to the present invention can be used for a variety of applications in which both optical properties and electrical properties are required.

While this invention has been particularly shown and described with reference to preferred embodiments thereof, it will be understood by those skilled in the art that various changes in form and details may be made therein without departing from the spirit and scope of the invention as defined by the accompanying claims and equivalents thereof.

What is claimed is:

1. A functional film disposed on a surface, the film comprising:
   a transition layer comprising
      a first constituent having SiO as a dielectric material, and
      at least one second constituent comprising at least one material selected from aluminum (Al), silver (Ag), silicon (Si), germanium (Ge), yttrium (Y), zinc (Zn), zirconium (Zr), tungsten (W) and tantalum (Ta), wherein the first and second constituents have corresponding gradual content gradients that vary according to a thickness of the functional film.

2. The functional film according to claim 1, wherein the gradual content gradients are distributed such that a refractive index gradually increases or decreases in an incident direction of external light according to the thickness of the functional film.

3. The functional film according to claim 1, wherein the gradual content gradients are distributed such that a light absorption efficiency gradually increases in an incident direction of external light according to the thickness of the functional film.

4. The functional film according to claim 1, wherein the gradual content gradients are distributed such that an electrical conductivity gradually increases or decreases according to the thickness of the functional film.

5. The functional film according to claim 1, wherein the gradual content gradients are distributed such that a content of the first constituent gradually decreases and a content of the second constituent gradually increases in an incident direction of an external light according to the thickness of the functional film.

6. The functional film according to claim 1, further comprising a substrate having the surface on which the functional film is deposited, wherein a refractive index difference at an interface between the functional film and said substrate is less than or equal to 0.5.

7. The functional film according to claim 1, further comprising a dielectric layer formed of SiO.

8. The functional film according to claim 7, further comprising a substrate having the surface on which the functional film is deposited, wherein said dielectric layer is formed between said substrate and the functional film such that said dielectric layer contacts said substrate.

9. The functional film according to claim 8, wherein a difference in a refractive index of said dielectric layer and said substrate is less than or equal to 0.5.

10. The functional film according to claim 1, further comprising a conductive layer consisting of at least one metal constituent selected from the group consisting of aluminum (Al), silver (Ag), silicon (Si), germanium (Ge), yttrium (Y), zinc (Zn), zirconium (Zr), tungsten (W) and tantalum (Ta).

11. The functional film according to claim 10, further comprising a substrate having the surface on which the functional film is deposited, wherein said conductive layer is formed on a face opposite an interface between the functional film and said substrate.

12. The functional film according to claim 8, further comprising a conductive layer formed of a metal constituent selected from the group consisting of Al, Ag, Si, Ge, Y, Zn, Zr, W and Ta, said conductive layer being formed on a face opposite to a face where the functional film contacts said dielectric layer.

13. A functional film disposed on a surface for use in a display, the film comprising:

a first constituent comprising SiO; and a second constituent comprising one of aluminum (Al), silver (Ag), silicon (Si), germanium (Ge), yttrium (Y), zinc (Zn), zirconium (Zr), tungsten (W) and tantalum (Ta), wherein a relative content of said first and second constituents varies within the functional film such that light incident on a first face of the functional film is variably refracted and does not pass through a second face of the functional film opposite the first face.

14. The function film of claim 13, wherein the relative content of said first and second constituents varies as a function of a distance from the first face.

15. The functional film of claim 14, wherein the function is a linear function.

16. The functional film of claim 14, wherein the function is a step function so as to produce stepped gradients.

17. The functional film of claim 13, further comprising layers disposed between the first and second faces, with each said layer having a corresponding relative content of said first and second constituents that is constant through said layer.

18. The functional film of claim 13, wherein the first face has a refractive index that is at or within 0.5 of a refractive index of glass.

19. The functional film of claim 18, wherein the glass is soda-lime glass.

20. The functional film of claim 13, further comprising a conductive layer deposited on the functional film above the second face.

21. The functional film of claim 20, wherein said conductive layer comprises at least one metal constituent selected from the group consisting of aluminum, silver, germanium, yttrium, zinc, zirconium, tungsten, and tantalum.

22. The functional film of claim 13, further comprising a dielectric layer formed on the first face.

23. The functional film of claim 22, wherein said dielectric layer is SiO.

24. The functional film of claim 23, further comprising a conductive layer deposited on the functional film above the second face, wherein said conductive layer comprises at least one metal constituent selected from the group consisting of aluminum, silver, germanium, yttrium, zinc, zirconium, tungsten, and tantalum.

25. The functional film of claim 13, wherein a refractive index of the functional film gradually changes as a function of a distance from the first face.

26. The functional film of claim 25, wherein a light absorption efficiency gradually increases as a function of the distance from the first face.

27. The functional film of claim 26, wherein an extinction coefficient gradually increases as a function of the distance from the first face.

* * * * *